United States Patent [19]
Yamauchi et al.

[11] Patent Number: 4,757,219
[45] Date of Patent: Jul. 12, 1988

[54] LAMINATION TYPE OF MAGNETOSTRICTOR AND MANUFACTURING METHOD THEREOF

[75] Inventors: Kiyotaka Yamauchi; Yoshihito Yoshizawa, both of Saitama; Kiyoshi Koyano, Kanagawa, all of Japan

[73] Assignees: Hitachi Metals, Ltd.; Hitachi Ltd., both of Tokyo, Japan

[21] Appl. No.: 824,108

[22] Filed: Jan. 30, 1986

[30] Foreign Application Priority Data

Jan. 30, 1985 [JP] Japan ................................ 60-16022

[51] Int. Cl.$^4$ .......................................... H01L 41/20
[52] U.S. Cl. .................................. 310/26; 73/DIG. 2
[58] Field of Search ................... 73/649, 570, DIG. 2; 310/26; 420/112, 117, 119; 148/403; 335/215; 156/73.1

[56] References Cited

U.S. PATENT DOCUMENTS

| 3,458,736 | 7/1969 | Heim | 310/26 |
| 4,236,946 | 12/1980 | Aboaf et al. | 148/403 |
| 4,308,474 | 12/1981 | Savage et al. | 310/26 |
| 4,374,665 | 2/1983 | Koon | 310/26 |
| 4,378,258 | 3/1983 | Clark et al. | 310/26 |

FOREIGN PATENT DOCUMENTS 850057 8/1970 Canada ........................... 156/73.1

Primary Examiner—Stewart J. Levy
Assistant Examiner—Louis M. Arana
Attorney, Agent, or Firm—Antonelli, Terry & Wands

[57] ABSTRACT

A lamination type of magnetostrictor incorporated with a mass of plural plates of amorphous metal alloy material laminated by means of a binder wherein the thickness of the plates is equal to or more than 80 μm and the space factor of amorphous metal alloy in the mass is equal to or more than 80% and a manufacturing method thereof.

9 Claims, 1 Drawing Sheet

LAMINATION TYPE OF MAGNETOSTRICTOR AND MANUFACTURING METHOD THEREOF

BACKGROUND OF THE INVENTION (1) Field of the Invention

The present invention relates to a magnetostrictor which transduces an electric energy to a mechanical energy and produces a vibration of gas or liquid. More particularly, it relates to a magnetostrictor comprising amorphous metal material as its magnetic component, which is usable for such variant devices as an ultrasonic cleaning machine, a frequency agile transmitter-receiver for microwave, a magnetostrictive delay device, a sensor utilizing magnetostrictive characteristics of the material etc.

(2) Description of the Prior Art

Presently, materials, such as Ni-Fe alloy(Magentostrictive coefficient $\lambda s=27\times 10^{-6}$), Fe-Co alloy($\lambda s=70\times 10^{-6}$) Fe-Al alloy($\lambda s=40\times 10^{-6}$), Mn-Ni ferrite($\lambda s=-27\times 10^{-6}$) are known as highly magnetostrictive materials. But each of these prior materials is provided with a rather small coefficient of electromechanical transduction(K) which represents its transformation efficiency of electric energy to mechanical energy and which is the most important characteristic of the material to be incorporated in a magneto-strictor as an ultrasonic vibrator. For example, the K-values of Ni-Fe alloys, Fe-Co, Fe-Al and Mn-Ni ferrites range respectively from 0.2 to 0.3, 0.2 to 0.4, 0.2 to 0.3 and 0.2 to 0.3.

On the other hand, amorphous metal alloys are known as materials provided with generally a high permeability because they have a random array of atoms therein and no crystallomagnetic anisotropy. Especially Fe-base amorphous metal alloys are known to have rather large magnetostriction coefficients($\lambda s$) as $45\times 10^{-6}$ and soft magnetic properties which result in rather large coefficients of electromechanical transduction(K) of 0.8 or more. These Fe-base amorphous metal alloys are expected to be excellent materials for use as magnetic components to be incorporated in magnetostrictors. Further, variations($\Delta E$) of Young's modulus(E) of these Fe-base amorphous metal alloys which are caused by bias magnetic fields are rather large values. For example, the $\Delta E/E$ value of Fe-base amorphous metal alloys could be equal to 1.91. The mentioned characteristics of Fe-base amorphous metal alloys make these alloys useful for miniaturized magnetostrictive delay devices which are capable of a continuous electro-control, or a small-sized frequency-agility type of transmitter-receiver of a microwave because the resonant frequency of a device comprising a Fe-base amorphous alloy can be varied for its large value of $\Delta E/E$. Fe-base amorphous metal alloys are provided with an extremely high tensile strength as 300 Kg/mm$^2$ and especially a Fe-base amorphous metal alloy comprising a small amount of Cr has a high corrosion resistance value of up to $10^4$ to $10^5$ times of a corrosion resistance value of a stainless steel, as well known. These highly magnetostrictive Fe-base amorphous metal alloys have excellent essential characteristics desirable for a practical material to be incorporated in a mangetostrictor. Many practical applications of these Fe-base amorphous metal alloys are described in Laid Open Patent Applications 49-112551 51-111698, 52-117002, 56-44203, 57-20076, 57-83997, 57-103499 and 58-5099.

But the descriptions in these Laid Open Patent Applications are silent about serious problems of the amorphous metal alloys to be incorporated in practical devices. That is, the thickness of an amorphous metal alloy is restricted, because a rapid quench of an alloy melt, the cooling rate of which is at least $10^5$ degrees/second is necessary. Because of the restriction, the thickness of Fe-base amorphous metal alloy sheets having a high magnetostriction ranges generally from 20 $\mu$m to 40 $\mu$m. It is necessary to laminate and bond a number of amorphous metal sheets to make a bar or a rather thick plate comprising amorphous metal material which is actually useful to be incorporated in a device such as an ultrasonic vibrator. But it has been found that the efficiency of a magnetostrictor comprising laminated thin amorphous sheets and a binder is extremely deteriorated, because the binding material becomes a dampener in it. The most important reason why a magnetostrictor comprising amorphous metal material is not practical is due to the mentioned problem of the lamination, although Fe-base amorphous metal alloys can be provided with a high magnetostriction, a high tensile strength, a high corrosion resistance, and a high variance($\Delta E$) of Young's modulus(E) caused by a bias magnetic field and a large coefficient of electromechanical transduction(K). It is proposed to make binder layers between amorphous metal sheets in a lamination type of bulk material as thin as possible, to exclude the above-mentioned problem in the Japan Laid Open Patent Application 57-103499. But Japan proposed method in the 57-103499 is not practical, because a special polishing process using a special abrasive is required to reduce the surface roughness Rz of amorphous metal sheets produced by a conventional method to a value of 0.5 $\mu$m to 1 $\mu$m from an original value of 2 $\mu$m to 3 $\mu$m, in order to make the binder layers extremely thin.

SUMMARY OF THE INVENTION

Accordingly, it is the object of the present invention to prevent an improved magnetostrictor comprising amorphous metal material wherein the previous problem of a binder layer acting as a dampener in a laminated bulk comprising a number of Fe-base amorphous metal sheets having a thickness of 20 $\mu$m to 40 $\mu$m is overcome.

According to this invention, there is provided a practical magnetostrictor made up of a plurality of laminated amorphous material plates each having a thickness greater than or equal to 80 $\mu$m and adhered to each other by means of a binder, wherein the volume ratio of amorphous metal material in the mass is greater than or equal to 80%, in order to overcome the problems in the prior art.

DESCRIPTION OF THE PREFERRED EMBODIMENTS

Figure 1:
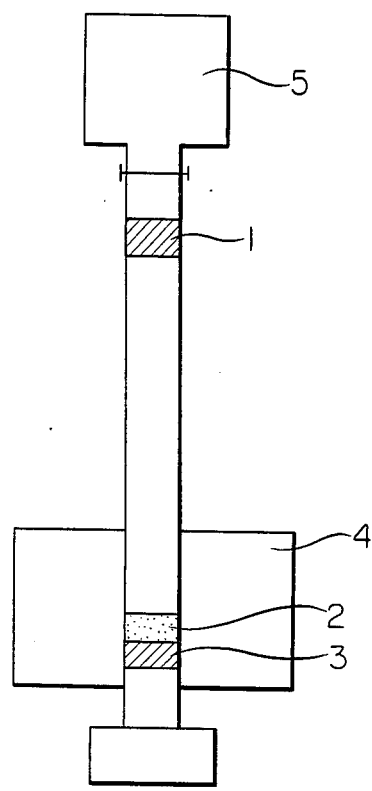
FIG. 1 is a simplified schematic view of an apparatus to produce a thick plate of amorphous metal material to be incorporated in the present invention.

The inventors found that a magnetostrictor comprising a bulk of plural plates of amorphous metal material which are laminated and adhered together by means of a binder could be a practical magnetostrictor, if thickness of each plate was greater than or equal to 80 μm and the volume ratio of amorphous metal in the bulk is greater than or equal to 80%.

It is preferable to use an amorphous material plate having a thickness of 0.1 mm to 0.2 mm to decrease the eddy current when the plate is electromagnetically energized at a frequency of about 10 KHz although the proper thickness of the plate depends on the frequency to be used to electromagnetically energize the plate. A thicker plate of amorphous metal material is preferable in a magnetostrictor to be energized by a lower frequency of current. On the contrary a thinner plate of amorphous metal material is preferably used in a magnetostrictor moved by a high frequency of current, but the thickness of the plate should be greater than or equal to 80 μm because the efficiency of the magnetostrictor becomes extremely small and unpractical if the thickness becomes a value of less than 80 μm. Although the volume ratio of amorphous metal material in the magnetic bulk material comprising plural plates of amorphous metal material laminated by means of a binder is preferably large, a volume ratio greater than or equal to 80% is sufficient to make the magnetostrictor practical.

The preferable composition range of an amorphous metal alloy incorporated in a magnetostrictor according to the invention can be described by the following formula;

$$Fe_{1-x-y-z}M_xCr_yM'_z$$

M: Co, Ni or a mixture thereof,
M': Si, B or a mixture thereof,
x: 0.05 to 0.30
y: 0.01 to 0.10
z: 0.16 to 0.27

The efficiency of a magnetostrictor is too small, if x-value of the alloy therein is less than 0.05 or exceeds 0.30. The plate made of amorphous metal material would have holes or microscopic defects which rust to form easily and would be unpractical if the y-value of the alloy is less than 0.01. On the other hand, the efficiency of the magnetostrictor deteriorates if the y-value of the alloy exceeds 0.1. It would be difficult to produce a plate comprising amorphous metal material, the thickness of which is greater than or equal to 80 μm, if the z-value is less than 0.16 or exceeds 0.27.

The inventors found that such a thick plate comprising amorphous metal material, the relative density or volume ratio of which is greater than or equal to 87%, could be compression-formed by an impact compression force applied to a raw material such as amorphous metal powder, amorphous metal flake, or amorphous metal strips. The mechanical strength of the mass composed of such plates laminated and adhered together by means of a binder deteriorates if the relative density or volume ratio of the plates is lower than 87%.

The plates can also be produced by an ultrasonic vibration energy applied to amorphous metal materials. The present invention is hereinafter explained by way of the Examples.

EXAMPLE 1

Figure 2:
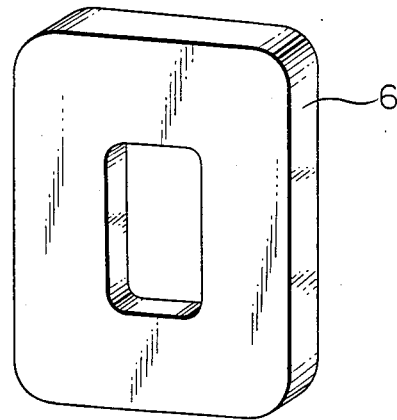
FIG. 2 is a inclined view of a thick plate composed of amorphous metal material for the present invention.

Various compositions of about 1 Kg weight of mother alloys as shown in Table 1 were cast in ingot forms after a melting in a high-frequency induction furnace. A melt spinning method of these mother alloys using a single quenching roller(Cu-roller) was applied to produce amorphous metal sheets having about 25 μm of thickness and about 20 mm of width. Each sheet was pulverized by a vibration mill to produce amorphous metal flakes having sizes about 20 μm to 3 mm. The flakes 2 were filled into a cavity formed by a die 3 and a container 4, as shown in FIG. 1 wherein the packing density of the flakes was about 3.3 to 3.9 g/cm³. A shock hammer 1 was accelerated by an explosion of powders located in the explosion room 5 to collide with the packed flakes 2 at a speed of about 3 Km/s to 7 Km/s to form a thick plate 6 of amorphous metal material having a shape outer dimensions of 20 mm×40 mm, inner dimensions of 7 mm×15 mm and a thickness of 0.05 to 2 mm as shown in FIG. 2. The produced plates of amorphous metal material presented no diffraction pattern of crystallinity in x-ray diffraction analyses.

TABLE 1

| Alloy No. | Component | | | | | |
|---|---|---|---|---|---|---|
| | Co | Ni | Cr | Si | B | Fe |
| 1 | 8 | — | 3 | 14 | 9 | Bal. |
| 2 | — | 8 | 3 | 14 | 9 | Bal. |
| 3 | 5 | 10 | 3 | 14 | 9 | Bal. |
| 4 | 8 | — | 3 | 8 | 14 | Bal. |
| 5 | — | 8 | 7 | 8 | 14 | Bal. |
| 6 | 12 | 12 | 5 | 8 | 14 | Bal. |
| 7 | 8 | — | 3 | 2 | 12 | Bal. |
| 8 | 8 | — | 3 | 5 | 25 | Bal. |
| 9 | 2 | — | 3 | 8 | 14 | Bal. |
| 10 | 8 | — | — | 8 | 14 | Bal. |
| 11 | 8 | — | 15 | 8 | 14 | Bal. |

TABLE 2

| Alloy No. | Sample No. | Plate Thickness (μm) | Relative Density of Plate (%) | Space Factor of Amorphous Metal (%) | η ea (%) | Corrosion Resistance | Cracks |
|---|---|---|---|---|---|---|---|
| 1 | 1-a | 200 | 97 | 91 | 75 | o | o |
| | 1-b | 400 | 95 | 92 | 70 | o | o |
| | 1-c | 1000 | 92 | 90 | 68 | o | o |
| 2 | 2-a | 200 | 97 | 91 | 76 | o | o |
| | 2-b | 200 | 85 | 80 | 65 | o | Δ |
| | 2-c | 1000 | 75 | 69 | 43 | o | x |
| 3 | 3-a | 200 | 97 | 92 | 74 | o | o |
| | 3-b | 60 | 97 | 77 | 40 | o | o |
| 4 | 4-a | 300 | 96 | 90 | 72 | o | o |
| 5 | 5-a | 300 | 96 | 91 | 63 | o | o |
| 6 | 6-a | 300 | 96 | 91 | 70 | o | o |
| 7 | 7-a | 50 | 87 | 75 | 40 | o | Δ |
| 8 | 8-a | 40 | 88 | 75 | 37 | o | Δ |
| 9 | 9-a | 300 | 93 | 84 | 54 | o | o |
| 10 | 10-a | 300 | 95 | 87 | 69 | x | o |
| 11 | 11-a | 300 | 96 | 89 | 51 | o | o |
| Mn—Ni | | 3000 | — | — | 58 | o | o |

TABLE 2-continued

| Alloy No. | Sample No. | Plate Thickness (μm) | Relative Density of Plate (%) | Space Factor of Amorphous Metal (%) | η ea (%) | Corrosion Resistance | Cracks |
|---|---|---|---|---|---|---|---|
| ferrite | | | | | | | | o: Excellent
Δ: Good
x: Poor

The formed plates of amorphous metal material were laminated and adhered together by means of an epoxy adhesive to produce a mass having a thickness of 2 mm which was incorporated in a magnetostrictor. The electroacoustic tranducing efficiencies(ηea) of the magnetostrictors incorporated with these masses comprising various amorphous metal alloys were measured by a motional impedance method. The experimental results of these measurements are shown in Table 2.

The occurrence of cracks in samples shown in Table 2 were evaluated during a microscopic observation of the sample surfaces after one hour of continous electroacoustic transduction tests for the magnetostrictors. The corrosion resistances of the samples were evaluated by an observation of rust after an isothermal humidistat test at 60° C. and 80% RH for 150 hours of the magnetostrictors having a mass composed of amorphous material plates laminated and adhered together by means of a binder. The magnetostrictors according to the invention have a high value of ηea, a high corrosion resistance and few cracks.

EXAMPLE 2

A thick plate having a thickness of about 100 μm was produced from laminating four sheets of amorphous metal alloy having the same composition as the alloy No. 1 in Example 1, by an ultrasonic bonding machine, after the sheets were punched to form a similar shape to the shape of the plate shown in FIG. 2. The conditions for the ultrasonic bonding are shown in Table 3.

TABLE 3

| Output | 1.2 KW |
|---|---|
| Amplitude | about 50 m |
| Pressure | 18 M P$_a$ |
| Pressing Time | 1.5 sec |

Characteristics of the magnetostrictor using this thick plate composed of amorphous metal material were evaluated by the measurement methods described in Example 1. The electroacoustic transduction efficiency(ηea) of the magnetostrictor was about 68, few cracks developed in it and it had a high corrosion resistance. It was confirmed that similar devices as ones produced by a process in Example 1 could be also produced by the process in Example 2.

As above stated, improved magnetostrictors comprising amorphous metal which is provided with a high efficiency, a high corrosion resistance, a high tensile strength et al. can be formed according to the invention.

What is claimed is:

1. A lamination type of magnetostrictor comprising a mass of a plurality of stacked plates of substantially amorphous metal alloy adhered together by means of a binder, wherein the thickness of the plates is greater than or equal to 80 μm and a volume ratio of amorphous metal alloy in the mass is greater than or equal to 80%.

2. A lamination type of magnetostrictor according to claim 1, wherein a volume ratio of the amorphous metal alloy in each of the plates is greater than or equal to 87%.

3. A lamination type of magnetostrictor according to claim 1, wherein the plates are comprised of pural sheets of amorphous metal alloy bonded together by an ultrasonic bonding method.

4. A lamination type of magnetostrictor according to claim 1, wherein the amorphous metal alloy has a composition formula as follows, $$Fe_{1-x-y-z}M_xCr_yM'_z$$

where M represents Co, Ni or a mixture thereof, M' represents B, Si or a mixture thereof, x is a value of 0.05 to 0.30, y is a value of 0.01 to 0.10 and z is a value of 0.15 to 0.27.

5. A manufacturing method of a magnetostrictor comprising the steps of:
    forming plates having a thickness greater than or equal to 80 μm of substantially amorphous metal alloy by a bonding of amorphous metal powders, amorphous metal flakes or amorphous metal strips by an impact compression;
    adhering a plurality of the plates together by means of a binder to form a mass where a volume ratio of amorphous metal alloy in the mass is equal to or more than 80%;
    making a magnetostrictor comprised of the mass.

6. A manufacturing method of a magnetostrictor according to claim 5, wherein the impact compression is performed utilizing a blast force.

7. A manufacturing method of a magnetostrictor according to claim 5, wherein the plates are made of laminated strips of amorphous metal alloy which are bonded together by means of an ultrasonic vibration.

8. A lamination type magnetostrictor comprising a mass of a plurality of stacked plates of substantially amorphous metal alloy, wherein the plates are adhered together by means of a binder, the thickness of each plate is greater than or equal to 80 μm, a volume ratio of amorphous metal alloy in each plate is greater than or equal to 87%, the volume ratio of amorphous metal alloy in the mass is greater than or equal to 80% and the amorphous metal alloy has a composition of the following formula:

$$Fe_{1-x-y-z}M_xCr_yM'_z$$

where M represents Co, Ni or a mixture thereof, M' represents B, Si or a mixture thereof, x is a value of 0.05 to 0.30, and y is a value of 0.15 to 0.27.

9. A lamination type magnetostrictor according to claim 8, wherein each plate is made up of stacked amorphous metal sheets bonded together by an ultrasonic bonding method.

* * * * *